(12) United States Patent
Nieminen

(10) Patent No.: US 7,272,771 B2
(45) Date of Patent: Sep. 18, 2007

(54) NOISE AND QUALITY DETECTOR FOR USE WITH TURBO CODED SIGNALS

(75) Inventor: Esko Nieminen, Oulu (FI)

(73) Assignee: Nokia Corporation, Espoo (FI)

( * ) Notice: Subject to any disclaimer, the term of this patent is extended or adjusted under 35 U.S.C. 154(b) by 455 days.

(21) Appl. No.: 10/696,926

(22) Filed: Oct. 30, 2003

(65) Prior Publication Data

US 2005/0097431 A1    May 5, 2005

(51) Int. Cl.
*H03M 13/00* (2006.01)
(52) U.S. Cl. .................... 714/755; 714/760; 714/786; 375/341; 375/262
(58) Field of Classification Search ................ 714/755, 714/786, 760; 341/341, 262
See application file for complete search history.

(56) References Cited

U.S. PATENT DOCUMENTS

| | | | | |
|---|---|---|---|---|
| 5,938,790 | A * | 8/1999 | Marrow ....................... | 714/795 |
| 6,654,927 | B1 * | 11/2003 | Sall et al. .................... | 714/786 |
| 6,888,901 | B2 * | 5/2005 | Yu et al. ...................... | 375/341 |
| 6,898,254 | B2 * | 5/2005 | Wolf et al. ................... | 375/340 |
| 6,904,555 | B2 * | 6/2005 | Nagase et al. ............... | 714/751 |
| 6,950,977 | B2 * | 9/2005 | Lavi et al. .................... | 714/794 |
| 6,988,233 | B2 * | 1/2006 | Kanai et al. ................. | 714/755 |

OTHER PUBLICATIONS

"Real-Time Algorithms and VLSI Architectures for Soft Output Map Convolutional Decoding",, Dawid, H., et al., in 6th IEEE International Symposium on Personal, Indoor and Mobile Radio Communications, Toronto, Canada, vol. 1, pp. 193-197, Sep. 1995.
"Memory Efficient Implementation of the BCJR Algorithm, in Proceedings of the 2nd International Symposium on Turbo Codes and Related Topics", Huettinger, S. et al., Brest, France, Sep. 4-7, 2000, pp. 479-482.

* cited by examiner

*Primary Examiner*—Guy Lamarre
*Assistant Examiner*—Esaw Abraham
(74) *Attorney, Agent, or Firm*—Harrington & Smith, PC

(57) ABSTRACT

In one aspect this invention provides a method to operate a decoder, and a decoder that operates in accordance with the method. The method includes monitoring, during operation of the decoder on a signal received from a channel, the value of at least one extrinsic value; and based on the monitored at least one value, determining whether the signal comprises a valid code word or comprises only noise. In a preferred, but non-limiting embodiment, the decoder comprises one of a LogMap or a MaxLogMap turbo decoder, and the decoder forms a part of a baseband section of a wideband code division multiple access (WCDMA) user equipment. During the process of decoding rounds the absolute values of extrinsic values tend to increase, provided that the input signal contains a valid code word, as opposed to when the input signal contains only noise, and where determining accurately distinguishes a valid code word from noise, and may also obtain information that is indicative of the quality of the decoding process.

34 Claims, 5 Drawing Sheets

| INPUT BIT | PRESENT ENCODER STATE | NEXT ENCODER STATE | STATE TRANSITION | PARITY BIT |
|---|---|---|---|---|
| 0 | 000 (0) | 000 (0) | 0 ↔ 0 | 0 |
| 1 | 000 (0) | 100 (4) | 0 ↔ 4 | 1 |
| 0 | 001 (1) | 100 (4) | 1 ↔ 4 | 0 |
| 1 | 001 (1) | 000 (0) | 1 ↔ 0 | 1 |
| 0 | 010 (2) | 101 (5) | 2 ↔ 5 | 1 |
| 1 | 010 (2) | 001 (1) | 2 ↔ 1 | 0 |
| 0 | 011 (3) | 001 (1) | 3 ↔ 1 | 1 |
| 1 | 011 (3) | 101 (5) | 3 ↔ 5 | 0 |
| 0 | 100 (4) | 010 (2) | 4 ↔ 2 | 1 |
| 1 | 100 (4) | 110 (6) | 4 ↔ 6 | 0 |
| 0 | 101 (5) | 110 (6) | 5 ↔ 6 | 1 |
| 1 | 101 (5) | 010 (2) | 5 ↔ 2 | 0 |
| 0 | 110 (6) | 111 (7) | 6 ↔ 7 | 0 |
| 1 | 110 (6) | 011 (3) | 6 ↔ 3 | 1 |
| 0 | 111 (7) | 011 (3) | 7 ↔ 3 | 0 |
| 1 | 111 (7) | 111 (7) | 7 ↔ 7 | 1 |

FIG. 1C
PRIOR ART

NOISE AND QUALITY DETECTOR FOR USE WITH TURBO CODED SIGNALS

TECHNICAL FIELD

This invention relates generally to telecommunications equipment, such as cellular telephones and personal communicators, and, more specifically, relates to a method and an apparatus for detecting the presence of a turbo coded signal, for distinguishing a received turbo coded signal from received noise and for monitoring quality of a turbo decoding process.

BACKGROUND

A signal propagation channel of a telecommunications system can cause interference during transmission through the channel. While interference can occur in many types of systems, in a wireless telecommunications system the transmission path typically attenuates and distorts the signal being transmitted in a number of ways. In the transmission path the interference is typically caused by multi-path propagation of the signal, by different types of fading and reflection, and by other signals transmitted through the same transmission path.

To reduce the influence of interference, different encoding methods have been devised to protect signals from interference and to eliminate errors caused by interference. One frequently used encoding method is convolutional encoding. In convolutional encoding the signal to be transmitted, consisting of symbols, is encoded into code words, which are based on the convolution of the symbols to be transmitted with polynomials. The convolutional code is defined by the coding ratio (rate) and coding polynomials. The coding ratio (k/n) defines the number (n) of encoded symbols in relation to the number (k) of symbols to be encoded. The constraint length K of the code refers to the degree of coding polynomials plus one. The convolutional encoder may be regarded as a state machine with $2^{K-1}$ states, and is typically implemented by means of shift registers.

A coding method developed from the convolutional coding method is known as a parallel concatenated convolutional coding method, also referred to as a turbo code. One technique to form a turbo coder is to use at least two recursive and systematic convolutional encoders and interleavers. The resulting code includes a systematic part, which directly corresponds to symbols in the coder input, and at least two parity parts, which are the outputs of the parallel convolutional encoders.

A signal which has propagated through a channel is decoded in a receiver. The convolutional code can be both encoded and decoded using a trellis whose nodes (or states) correspond to the states of the encoder used in signal encoding. The paths between nodes that belong to two successive trellis phases of the trellis correspond to allowed state transitions between the encoder states. The code unequivocally attaches to each state transition: the initial and the final state of the transition, the bit being encoded, and the bits of the encoding result.

The purpose of a decoder at a receiver is to derive the original data bits (at the transmitter) from a received code word. In order to perform this function the decoder typically works with metrics. There are two types of metrics used by the decoder: path metrics (also referred to as state metrics) and branch metrics. The path metrics represent the probability that the set of symbols included in the received signal lead to the state corresponding to the node in question. The branch metrics are proportional to the probabilities of transitions between states.

The well-known Viterbi algorithm is often used for decoding a convolutional code. An example of a decoding method that requires more intensive calculation is a MAP (Maximum Aposteriori Probability) algorithm and its variations, e.g., LogMAP algorithm or MaxLogMAP algorithm. The MAP algorithm is also known as a BCJR algorithm (Bahl, Cocke, Jelinik and Raviv). The MAP algorithm and its variations typically provide a considerably better result than the Viterbi algorithm. Furthermore, since the MAP algorithm and its variations are examples of SISO (Soft Input Soft Output) algorithms, they are particularly well suited for iterative decoding, e.g. for decoding a turbo code where a posteriori probabilities can be utilized. In contradistinction to the MAP-based algorithms, the basic Viterbi algorithm is a Hard Output algorithm that must be converted to obtain soft decisions, which increases its calculation complexity. The algorithms obtained through conversion of the Viterbi algorithm are not, however, as effective as MAP-based algorithms.

To estimate a posteriori probabilities, the MAP algorithm and its variations typically require path metrics for each bit to be decoded, both from the beginning of the trellis to its end, and from the end to the beginning, at the bit in question. According to the prior art, the values of the path metrics of all nodes are stored in a memory in each trellis phase in respect to one direction, e.g., forward through the trellis, and the values are calculated for the other direction, e.g., backwards through the trellis.

A sliding window is typically applied to reduce the memory requirement. The sliding window involves calculating and storing either forward or backward path metrics, with respect to a window of a certain constant length, and then reading the stored path metrics in inverse order. This type of operation is described by H. Dawid and H. Meyr: Real-Time Algorithms and VLSI Architectures for Soft Output Map Convolutional Decoding, in 6th IEEE International Symposium on Personal, Indoor and Mobile Radio Communications, Toronto, Canada, Volume 1, pp. 193-197, September 1995.

Another solution to reduce use of memory is to use the LogMAP algorithm, instead of the MaxLogMAP algorithm, to invert the original calculation direction of path metrics, which makes the additional memory unnecessary. This approach is described by S. Huettinger, M. Breiling and J. Huber: Memory Efficient Implementation of the BCJR Algorithm, in Proceedings of the 2nd International Symposium on Turbo Codes and Related Topics, Brest, France, 4-7 September 2000.

Described now with reference to FIG. 1A is an embodiment of a conventional wireless telecommunications system 1 having a transmitter 10 and a receiver 20. In the example the transmitter 10 and the receiver 20 communicate via a radio channel 30. The transmitter 10 includes a data source 12, which may be a speech encoder or another conventional data source used in circuit-switched or packet-switched data transmission.

A signal to be transmitted is received from the output of the data source 12 and supplied to a channel encoder 14, which in this case is a convolutional encoder, preferably a turbo encoder. The encoded symbols are supplied to a modulator 16, where the signal is modulated in a prior art manner. The modulated signal is supplied to a radio frequency block 18, where it is amplified and transmitted to the radio path 30 by an antenna 18A. In the radio path 30 the signal is affected by interference and typically by noise as well. The receiver 20 includes an antenna 22A for receiving the signal, which is supplied to a demodulator 24 via a radio frequency block 22. The demodulated signal is supplied to a channel decoder 26, where the signal is decoded for convolutional codes or turbo codes by a method that produces path metrics over a trellis. From the decoder 26 the decoded signal is supplied to a data sink 28, such as audio circuitry or digital message circuitry.

FIG. 1B illustrates a conventional ½-rate convolutional encoder 14, also known as a recursive systematic convolutional encoder. A set of successive encoder states, referred to as a trellis, is naturally related to each convolutional code. The nodes of two successive trellis phases are connected by paths, which are determined by the state transitions allowed by the convolutional code. The convolutional code attaches to the initial and the final state, the bit to be encoded and the bits of the encoding result to each state transition.

An eight-state systematic and recursive encoder for a convolutional code is next described with reference to FIG. 1B and the Table shown in FIG. 1C.

An input bit, which is described in the first column of the Table, enters the input of the encoder 14. The present state of the encoder 14, i.e., the bits from each delay element (DE) 14A, 14B, 14C are illustrated in the second column of the Table (present encoder state). The third column in the Table shows the next state of the encoder 14. The encoder 14 has two outputs: a systematic bit (SD) and a parity bit (P0), which is illustrated in the fifth column of the Table. Thus, the coding result of one state transition of the encoder 14 involves two bits: the systematic bit SD and the parity bit P0. The encoder 14 further includes summing blocks 14D, 14E, 14F and a feedback line 14G for implementing recursion.

In practical embodiments it is advantageous if the initial and final states of the encoder 14 are pre-determined. For this reason encoding usually begins in a certain state and ends in a pre-determined known state. During encoding the shift of the encoder 14 to a pre-determined final state is referred to as termination, and the bits that are encoded during the shift are referred to as termination bits, which are not actual data. The initial state often contains zero bits only, and the termination also shifts the encoder 14 back to the zero state. This is not, however, always necessary, although this mode of operation facilitates the functioning of the corresponding decoder 26.

FIG. 2 illustrates the structure of a conventional turbo encoder 40 that includes two encoders 42, 44 and an interleaver 46. The bits to be encoded are supplied as such to the output of the turbo encoder 40. This component is called the systematic part SD of the code. The bits to be encoded are also supplied as such to the first encoder 42 and the turbo interleaver 46. The interleaved bits are supplied to the second encoder 44. The output bits PA0, PA1 of the first encoder 42 and the output bits PB0, PB1 of the second encoder 46 are referred to as the parity parts of the code, where PA0 and PA1 are the parity of ascending order and PB0 and PB1 are the parity of interleaved order. The ascending order means the address order in which the original data bits enter the first encoder 42. The interleaved order is the order in which the original data bits enter the second encoder 44.

FIG. 3 illustrates the general structure of a conventional turbo decoder 50 in the case of a ⅕ turbo code. The input to the turbo decoder 50 is the systematic part $SD_k$ of the code and four parity parts $PA0_k$, $PA1_k$, $PB0_k$, and $PB1_k$. The turbo decoder 50 comprises two decoder units 52 and 54, also referred to herein as a first unit A and a second unit B. The input to the first decoder unit A includes the systematic part $SD_k$ and the parity parts $PA0_k$ and $PA1_k$ of the code. Furthermore, the input to the first decoder unit A includes extrinsic values $EV_k$ from a preceding iteration round. The extrinsic values arrive from the output of the second unit B via a deinterleaver 58. The output of the first unit A includes a new extrinsic value $EV_k$, which is supplied as an input to the second unit B via an interleaver 56, and an output A that includes both a soft value $SV_{A,k}$ and a hard decision on each bit. The output A may be supplied to the other parts of the receiver 20, if desired. The input to the second unit B also includes the systematic part $SD_k$ of the code, which arrives via the interleaver 56, and the parity parts $PB0_k$ and $PB1_k$ of the code. Moreover, the input to the second decoder unit B includes extrinsic values $EV_k$ from a preceding iteration round. The extrinsic values arrive from the output of the second unit A via an interleaver 56. The output of the second unit B is the new extrinsic value $EV_k$, which is supplied to the first unit A via the deinterleaver 58, and an output B that includes both soft values $SV_{B,n}$ and a hard decision for each bit that is supplied to the other parts of the receiver 20, if desired. In this scheme one turbo round is assumed to include one consecutive decoding by the unit A and the unit B (beginning with either unit). At the beginning of decoding, all extrinsic values can be set to zero.

The trellis processing performed in connection with the MAP algorithm and its variations, e.g., the LogMAP algorithm and the MaxLogMAP algorithm, that is used in the decoder units A and B includes three main steps: i.e., the forward calculation of path metrics, the backward calculation of path metrics, and the combination of the path metrics calculated by the forward and backward techniques for the calculation of a new extrinsic value, a soft decision, and a hard decision for each data bit. The new extrinsic values are supplied as an input parameter signal to the next iteration round, whereas the hard bit decision is made on the basis of the sign of the soft decision. The branch metrics are typically proportional to the logarithms of the transition probabilities.

In practice, the interleaver 56 and the deinterlever 58 are often implemented using a single interleaver, and the serial decoder (decoders 52 and 54) is implemented using a single decoder unit that performs the functions of the decoder A and decoder B in turn. The decoders A and B can also be arranged in parallel. In this case the decoder units A and B are implemented as separate parallel decoders.

At the output of the decoder A, the soft value $SV_{A,k}$ of each original data bit can be written as:

$$SV_{A,k}=SD_k+EV_{B,k,old}+EV_{A,k,new},$$

where $EV_{B,k,old}$ represents extrinsic values calculated by the previous decoder step B, $EV_{A,k,new}$ are new extrinsic values calculated by the present decoder step A, and $SD_k$ are systematic data samples. The sign of the soft value $SV_{A,k}$ is a hard decision on a $k^{th}$ received data bit. The corresponding formula for the soft value $SV_{B,n}$ at the output of the decoder B is $$SV_{B,n}=SD+EV_{A,n,old}+EV_{B,n,new}$$

where $EV_{A,n,old}$ represents extrinsic values calculated by the previous decoder step A, $EV_{B,n,new}$ are new extrinsic values calculated by the present decoder step B, and $SD_n$ are systematic data samples. An important difference between the two soft values is an order that is defined by a turbo interleaver: n=$k^{th}$ interleaver index.

Usually it can be determined from the context which soft value formula is being applied and therefore the following simplified formula for the soft value $SV_m$ can be used:

$$SV_m = SD_m + EV_{m,old} + EV_{m,new}$$

where $EV_{m,old}$ represents extrinsic values calculated by the previous decoder step. $EV_{m,new}$ are new extrinsic values calculated by the present decoder step, and $SD_m$ are systematic data samples.

The decoding process is iterative and therefore the receiver 20 will typically set an upper limit on the number of iterations (e.g., a maximum of 10 iterations is typically sufficient). In general, the reliability of the output hard decisions increases as the number of iterations increases.

Regardless of the particular algorithm selected for decoding a turbo coded code word, a problem that is encountered with communication systems having flexible data rates is the detection of the existence of a received turbo coded code word in the presence of channel noise. For example, the use of a flexible data rate implies that the receiver does not know if it has received a signal that consists solely of noise, that is, the received signal does not contain a turbo coded code word at all, or if it has received a noisy, but valid, turbo coded code word. As can be appreciated, to ensure proper operation the receiver must be capable of distinguishing between received noise and a received, albeit noisy, turbo coded code word.

As a more specific statement of a current problem, based on the current version of a standard (TS 25.212) a user equipment (UE), such as a mobile cellular telephone, is expected to perform single transport format detection, among other things, for turbo coded channels. In the single transport format mode of transport format detection there are two possibilities: the UE receives noise or it receives a (turbo coded) code word. If the UE fails to detect the reception of only noise, that is, if the UE erroneously assumes that a code word was received, the power control of overall wireless communications system can be adversely affected. This is true because the power control is based on cyclic redundancy check (CRC) bits. When receiving just noise, the CRC check performed by the UE fails and the UE will request more power. However, the UE should not request more power when receiving just noise as erroneous power requests can destabilize system power control. As such, it is important that the UE be able to accurately distinguish between received noise and true (turbo coded) code words. Prior to this invention, this important need was not adequately addressed.

SUMMARY OF THE PREFERRED EMBODIMENTS

The foregoing and other problems are overcome, and other advantages are realized, in accordance with the presently preferred embodiments of these teachings.

The invention provides a solution to the problem of detecting the existence of a turbo coded signal, and of distinguishing a received turbo coded code word from received noise.

In one aspect this invention provides a method to operate a decoder, and a decoder that operates in accordance with the method. The method includes monitoring, during operation of the decoder on a signal received from a channel, the value of at least one extrinsic value; and based on the monitored at least one value, determining whether the signal comprises a valid code word or comprises only noise.

In a preferred, but non-limiting embodiment, the decoder comprises one of a LogMap or a MaxLogMap turbo decoder, and the decoder forms a part of a baseband section of a wideband code division multiple access (WCDMA) user equipment.

During the process of decoding rounds the absolute values of extrinsic values tend to increase, provided that the input signal contains a valid code word, as opposed to when the input signal contains only noise, and where determining accurately distinguishes a valid code word from noise, and may also obtain information that is indicative of the quality of the decoding process.

BRIEF DESCRIPTION OF THE DRAWINGS

The foregoing and other aspects of these teachings are made more evident in the following Detailed Description of the Preferred Embodiments, when read in conjunction with the attached Drawing Figures, wherein:

FIG. 1C illustrates a Table that is useful in describing an eight-state systematic and recursive encoder;

DETAILED DESCRIPTION OF THE PREFERRED EMBODIMENTS

Figure 1A:
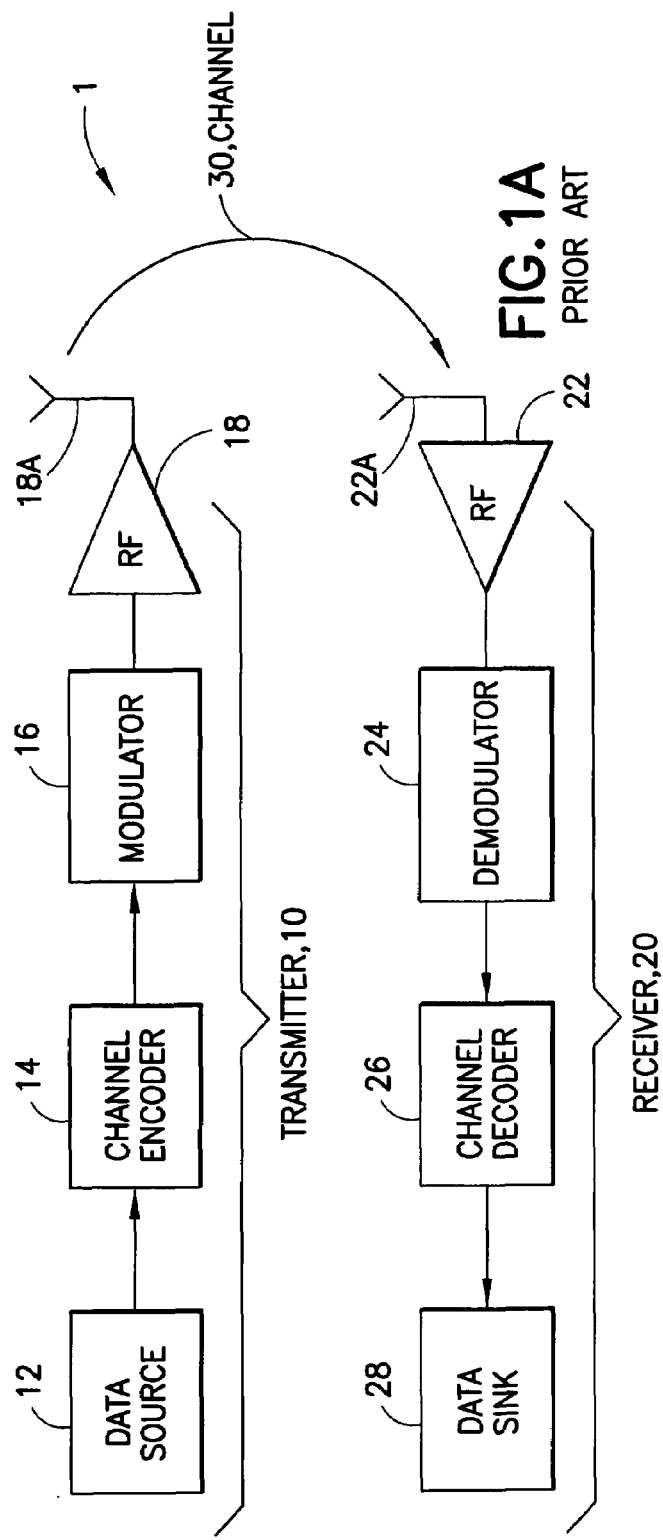
FIG. 1A is a block diagram of a conventional wireless telecommunications system having a transmitter and a receiver that communicate through a channel.
Figure 1B:
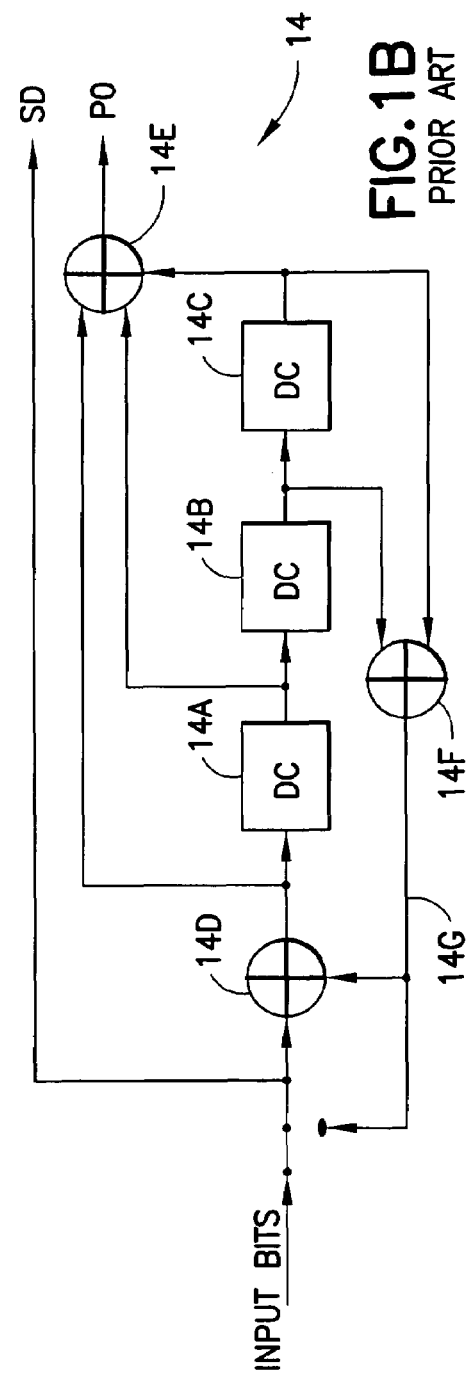
FIG. 1B illustrates a conventional ½-rate convolutional encoder.
Figure 2:
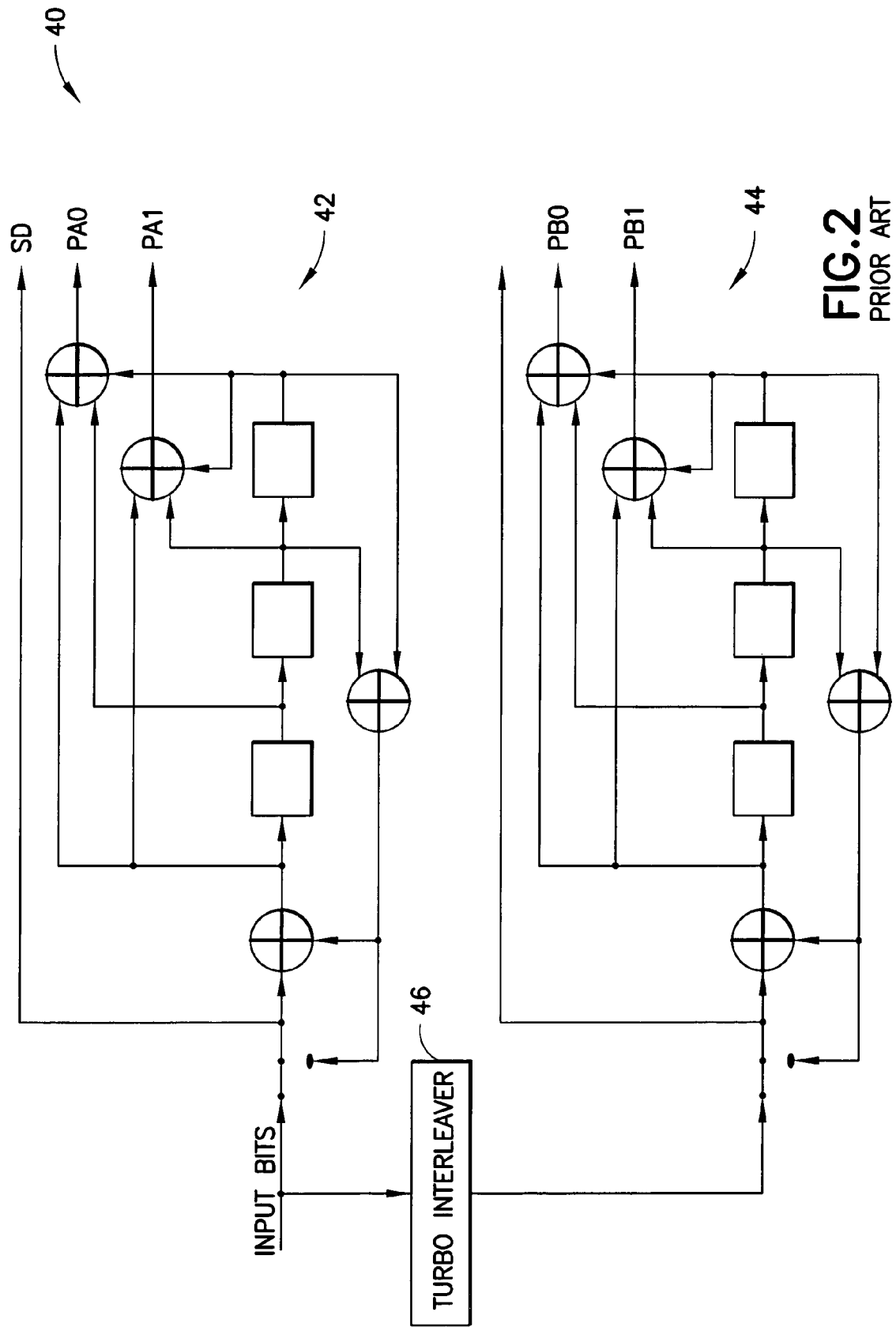
FIG. 2 illustrates the structure of a conventional turbo encoder having two encoders and an interleaver.
Figure 3:
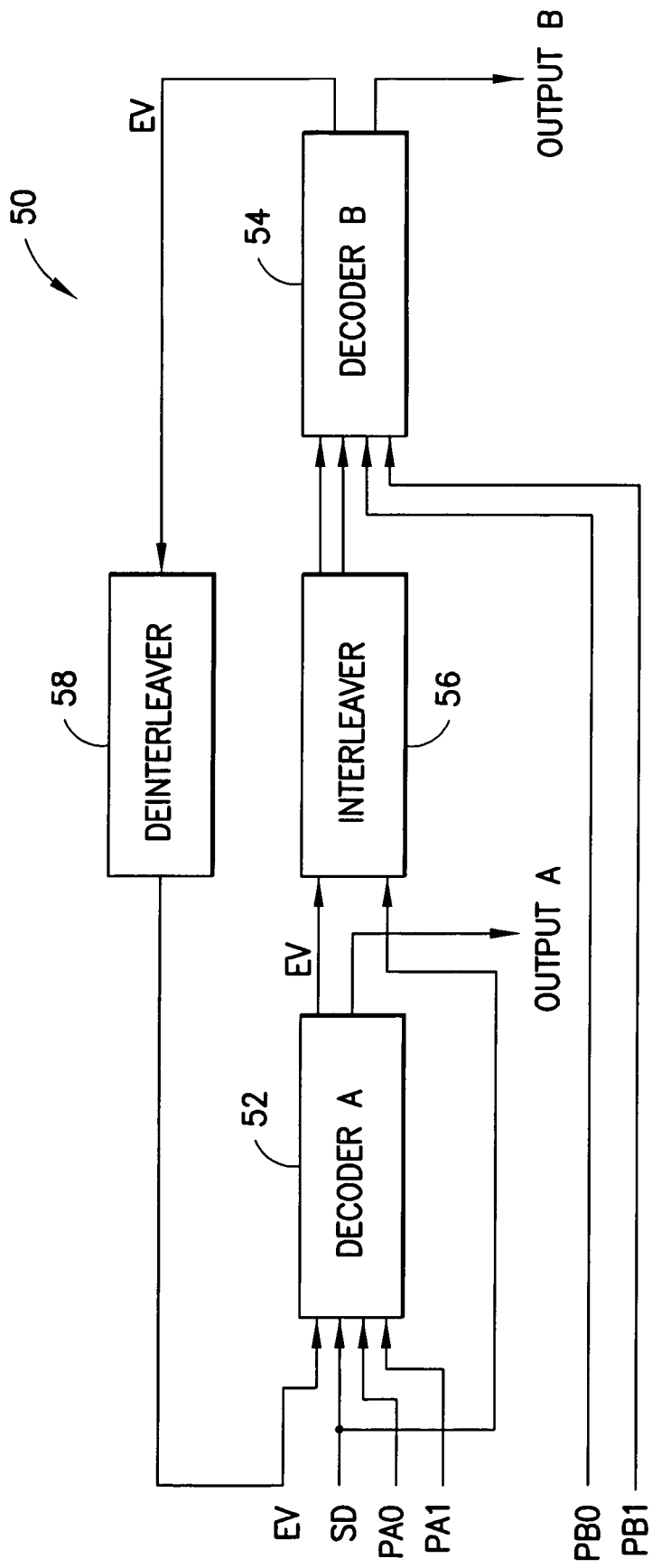
FIG. 3 illustrates the structure of a conventional turbo decoder for the case of a ⅓ turbo code.
Figure 4:
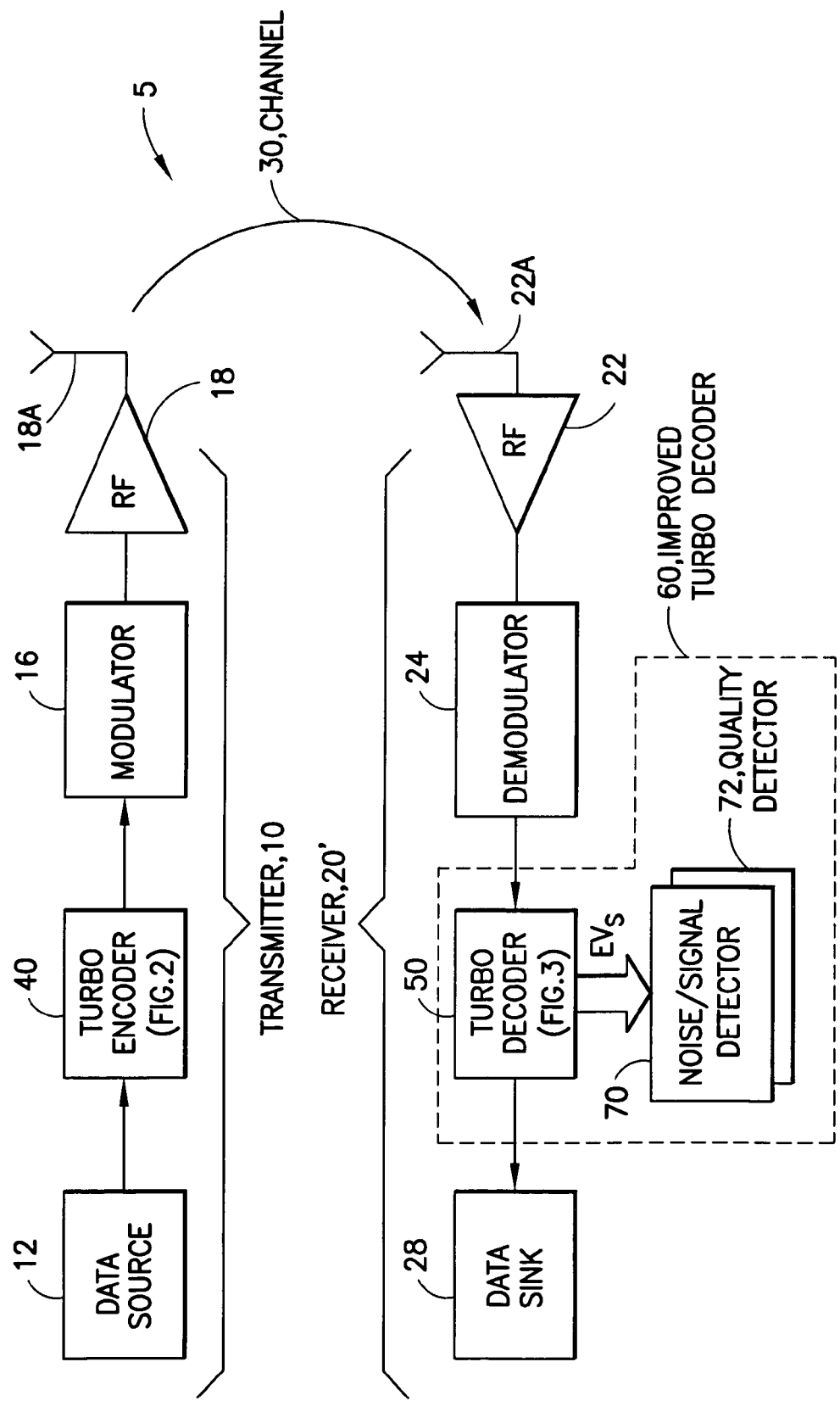
FIG. 4 shows a block diagram of an improved wireless telecommunications system that includes a turbo decoder in the receiver, and a noise/signal (and optional quality) detector that operates with the turbo decoder, in accordance with this invention, to provide an improved turbo decoder.

FIG. 4 illustrates a block diagram of a wireless telecommunications system 5 that includes a turbo decoder, such as the turbo decoder 50 of FIG. 3, in an improved receiver 20', where the receiver 20' includes a noise/signal (and optional quality) detector 70 that operates with the turbo decoder 50 in accordance with this invention to provide an improved turbo decoder 60. The other components of the system 5 may be as described above, and the turbo encoder 40 of FIG. 2 can be used in the transmitter 10. It can be appreciated that the receiver 20' may form a part of a UE, such as a cellular telephone, in particular a WCDMA-enabled cellular telephone.

An aspect of this invention is related to the behavior of the extrinsic values (EVs) during iterative turbo decoding. The inventor has exploited the observation that for the case where the received signal contains a turbo coded code word, the absolute values of the extrinsic values tend to increase during the decoding process. This implies that the extrinsic values tend to amplify the soft values more as the decoding process continues (as more iterations are performed). However, if a received signal does not contain a turbo coded code word, that is, when the received signal is simply noise, then the absolute values of the extrinsic values do not increase at all. This observation thus provides the basis of the operation of the noise/signal detector 70, and is exploited by same to determine whether a received signal contains only a noise signal or a noisy but valid turbo coded code word signal. The noise/signal detector 70 may thus be considered to form a part of the turbo decoder 50, and to thus together provide the improved turbo decoder 60.

The turbo decoder 60 in accordance with this invention monitors a sum of absolute values of extrinsic values during the decoding process and determines from the growth rate of the sum if a signal containing a turbo coded code word was received. It has been found that the most reliable results are obtained by monitoring the extrinsic values of a first and a last turbo round.

The following symbol definitions are useful in explaining the operation of the noise/signal detector 70:

the symbol $SE_A E_B(n)$ denotes a sum of absolute values of soft values after an $n^{th}$ turbo round;

the symbol $E_A E_B(n)$ denotes a sum of absolute values of sums of extrinsic values of A-parities and extrinsic values of B-parities after an $n^{th}$ turbo round;

the symbol $E_A(n)$ denotes a sum of absolute values of extrinsic values of A-parities after the $n^{th}$ turbo round;

the symbol $E_B(n)$ denotes a sum of absolute values of extrinsic values of B-parities after the $n^{th}$ turbo round;

the symbol $SE_A(n)$ denotes a sum of absolute values of sums of systematic samples and extrinsic values of A-parities after the $n^{th}$ turbo round;

the symbol $SE_B(n)$ denotes a sum of absolute values of sums of systematic samples and extrinsic values of B-parities after the $n^{th}$ turbo round; and the symbol S denotes a sum of absolute values of systematic samples.

Based on the foregoing definitions, the existence of a turbo coded code word within noise, and other disturbing factors, is accomplished by the noise/signal detector 70 through the use of the following inequalities, where L represents the number of the last turbo round, where $\leq$ represents 'less than or equal to', and where × represents times (multiplication):

1) $SE_A E_B(L) \leq const \times SE_A E_B(1)$; e.g. const=1.125;
2) $SE_A E_B(L) \leq const \times S$; e.g. const=1.5;
3) $SE_A(L) \leq const \times S$; e.g. const=1.25;
4) $SE_B(L) \leq const \times S$; e.g. const=1.25;
5) $E_A(L) \leq const \times E_A(1)$; e.g. const=2;
6) $E_B(L) \leq const \times E_B(1)$; e.g. const=2;
7) $E_A E_B(L) \leq const \times E_A E_B(1)$; e.g. const=2;
8) $E_A(L) \leq const \times S$; e.g. const=0.8;
9) $E_B(L) \leq const \times S$; e.g. const=0.8.

If any one of the foregoing nine inequalities is found to be true, then the noise/signal detector 70 determines that a received signal does not carry a turbo coded code word, i.e., the received signal simply carries noise.

It is also within the scope of this invention to use the nine inequalities listed above (or a sub-set thereof) to monitor the quality of the output of the turbo decoder 50. In this case the threshold value of the constant (const) is increased so that it becomes greater than the threshold value used for the noise detector. Thus, by defining two sets of threshold constants it becomes possible to have two detectors, one is the noise/signal detector 70, and the other is a quality detector 72. One important advantage that is realized by the use of the quality detector 72 is that the UE does not require the cyclic redundancy check (CRC) for monitoring signal quality.

A quality detector monitors how well a turbo decoding procedure converges, whereas a noise signal detector monitors whether or not a turbo decoding procedure begins to converge. If a turbo decoding procedure fails to begin to converge, then it is concluded that a signal does not carry a turbo coded code word. On the other hand, if a turbo decoding procedure begins to converge, then it is possible to monitor how well the convergence takes place. Therefore the threshold constant of a quality detector is greater than that of a noise signal detector. For example, the noise signal detector inequalities (8) and (9) have the threshold constant 0.8, but when applying the inequality (8) or (9) as a quality detector the threshold constant equals 6.0 or so. The inequalities (3) and (4) have the threshold 1.25 for a noise signal detector but they have the threshold 10.5 for a quality detector. Proper values with reasonable accuracy for threshold constants can be found by simulations.

Based on the foregoing description it should be apparent to those skilled in the art that this invention is based on a property of the extrinsic values of LogMap or MaxLogMap turbo decoders. When the turbo decoder performs decoding rounds the absolute values of the extrinsic values tend to increase during each round, provided that the input data contains a valid code word. When input data contains just noise (e.g., AWGN), then the absolute values of the extrinsic values do not increase, nor do they converge to some large values. This invention exploits this property of turbo decoders to accurately distinguish code words from noise, and also to obtain information that is indicative of the quality of the turbo decoding process.

A sum of absolute values of systematic samples can be replaced or complemented by sums of absolute values of parity samples. Usually puncturing of bits at a transmitter is applied to parity bits of turbo encoded data blocks and systematic bits are left intact. Therefore, the use of parity samples in the inequalities having sums of absolute values of systematic samples results in more unreliable functioning of the signal and quality detector. However, in some applications, puncturing of bits can be taken into account when calculating sums of absolute values of parity samples and so the use of parity samples does not have any negative side effects.

An aspect of this invention estimates the absolute values of certain expressions from the signals of the turbo decoder 50, and compares them using inequalities. The value of a particular threshold constant (const) may be adjusted or tuned, as it is a function of a particular coding rate and a length of a code word (weakly). Although nine different inequalities are shown above, in a practical implementation not all nine need be considered. As an example, in a minimal case only one inequality need be considered, or just two, etc.

It is within the scope of this invention to make the number of members of the set of considered inequalities to be adjustable or adaptive, based on estimated or measured channel conditions, and/or coding rate and/or other factors, and/or to make the type or types of inequalities considered adjustable or adaptive, based on channel conditions, coding rate and/or other factors.

This invention can be implemented using software, or hardware, such as an ASIC, or a combination of both. A presently preferred embodiment uses a combination of software and hardware, where an ASIC provides estimates for selected ones of the absolute values, and a UE digital signal processor (DSP) performs the comparison(s) using a proper value of a threshold constant.

As was noted, the particular value of a given threshold constant can be a function of coding rate and the length of a code word. As such, it is desirable to compute and store an array of threshold values for commonly used coding rates, such as coding rates of ½, ⅖, and ⅓, for example. The array can be generated by computer simulations over different channel conditions. If a number of different channel coding parameters is small, the array can be derived from the results of field and laboratory tests as well. In practical applications both methods to look for proper values for threshold constants works fine because a given communication system uses only a finite number of different coding schemes. While the length of the code word is a factor, it has such a weak relationship to the value of the threshold constant that in practical implementations it may be ignored.

Table 1 illustrates how the values of the ratio $SE_A(k)/S$ increase for turbo rounds k=1, 2, 3, . . . , 16 when a received signal carries a turbo code word within additive white Gaussian noise. The number of data bits per frame in this example is 4000 and the coding rate is ⅓. The level of noise in each column changes as is shown in the last row of Table 1.

TABLE 1

| Round k | The ratio $SE_A(k)/S$ for a frame of 4000 bits | | | | | | | |
|---|---|---|---|---|---|---|---|---|
| 1 | 1.703 | 1.799 | 1.913 | 2.049 | 2.209 | 2.396 | 2.606 | 2.843 |
| 2 | 1.924 | 2.159 | 2.489 | 2.947 | 3.554 | 4.314 | 5.195 | 6.158 |
| 3 | 2.017 | 2.401 | 3.063 | 4.158 | 5.719 | 7.571 | 9.352 | 10.755 |
| 4 | 2.079 | 2.651 | 3.897 | 6.207 | 9.083 | 11.329 | 12.419 | 12.758 |
| 5 | 2.129 | 2.970 | 5.238 | 9.061 | 11.941 | 12.900 | 13.022 | 12.956 |
| 6 | 2.179 | 3.433 | 7.110 | 11.463 | 13.001 | 13.145 | 13.071 | 12.967 |
| 7 | 2.237 | 4.087 | 9.052 | 12.672 | 13.218 | 13.169 | 13.075 | 12.968 |
| 8 | 2.311 | 4.899 | 10.571 | 13.113 | 13.251 | 13.172 | 13.075 | 12.968 |
| 9 | 2.405 | 5.760 | 11.573 | 13.255 | 13.256 | 13.172 | 13.075 | 12.968 |
| 10 | 2.518 | 6.569 | 12.183 | 13.300 | 13.257 | 13.172 | 13.075 | 12.968 |
| 11 | 2.644 | 7.273 | 12.546 | 13.316 | 13.257 | 13.172 | 13.075 | 12.968 |
| 12 | 2.776 | 7.862 | 12.766 | 13.322 | 13.257 | 13.172 | 13.075 | 12.968 |
| 13 | 2.909 | 8.343 | 12.905 | 13.325 | 13.257 | 13.172 | 13.075 | 12.968 |
| 14 | 3.035 | 8.736 | 12.997 | 13.327 | 13.257 | 13.172 | 13.075 | 12.968 |
| 15 | 3.154 | 9.058 | 13.060 | 13.327 | 13.257 | 13.172 | 13.075 | 12.968 |
| 16 | 3.265 | 9.320 | 13.106 | 13.328 | 13.257 | 13.172 | 13.075 | 12.968 |
| EbNo | 0.000 | 0.200 | 0.400 | 0.600 | 0.800 | 1.000 | 1.200 | 1.400 |

Table 2 illustrates how the values of the ratio $SE_A(k)/S$ behave for turbo rounds k=1, 2, 3, . . . , 16 when a received signal consists of additive white Gaussian noise. The turbo decoder is applied assuming the number of data bits per frame is 4000 and the coding rate is ⅓. The level of noise in each column changes as is shown in the last row of Table 2.

TABLE 2

| Round k | The ratio $SE_A(k)/S$ for a frame of 4000 bits | | | | | | | |
|---|---|---|---|---|---|---|---|---|
| 1 | 1.221 | 1.221 | 1.221 | 1.221 | 1.221 | 1.221 | 1.221 | 1.221 |
| 2 | 1.230 | 1.230 | 1.231 | 1.231 | 1.230 | 1.230 | 1.230 | 1.230 |
| 3 | 1.231 | 1.231 | 1.231 | 1.231 | 1.231 | 1.230 | 1.230 | 1.230 |
| 4 | 1.231 | 1.231 | 1.231 | 1.231 | 1.231 | 1.230 | 1.231 | 1.231 |
| 5 | 1.231 | 1.231 | 1.231 | 1.230 | 1.231 | 1.230 | 1.230 | 1.231 |
| 6 | 1.231 | 1.231 | 1.231 | 1.230 | 1.231 | 1.230 | 1.230 | 1.231 |
| 7 | 1.231 | 1.231 | 1.231 | 1.230 | 1.231 | 1.230 | 1.231 | 1.231 |
| 8 | 1.230 | 1.231 | 1.231 | 1.231 | 1.230 | 1.230 | 1.230 | 1.231 |
| 9 | 1.230 | 1.231 | 1.231 | 1.231 | 1.230 | 1.231 | 1.231 | 1.231 |
| 10 | 1.231 | 1.231 | 1.231 | 1.231 | 1.231 | 1.230 | 1.231 | 1.231 |
| 11 | 1.231 | 1.231 | 1.231 | 1.231 | 1.231 | 1.231 | 1.231 | 1.231 |
| 12 | 1.231 | 1.231 | 1.231 | 1.231 | 1.231 | 1.231 | 1.231 | 1.231 |
| 13 | 1.231 | 1.231 | 1.231 | 1.231 | 1.231 | 1.231 | 1.231 | 1.231 |
| 14 | 1.231 | 1.231 | 1.231 | 1.231 | 1.231 | 1.231 | 1.231 | 1.231 |
| 15 | 1.231 | 1.231 | 1.231 | 1.231 | 1.230 | 1.231 | 1.231 | 1.231 |
| 16 | 1.231 | 1.231 | 1.231 | 1.231 | 1.231 | 1.231 | 1.231 | 1.231 |
| EbNo | 0.000 | 0.200 | 0.400 | 0.600 | 0.800 | 1.000 | 1.200 | 1.400 |

As Tables 1 and 2 illustrate, in order to distinguish receiving a true noisy turbo code word from receiving just noise using the inequality (3) given above (i.e. $SE_A(L) \leq const \times S$), the value of the threshold constant should be in the range of 1.25-1.60. Further, to monitor the quality of convergence of a turbo decoding process by the inequality (3), a proper value for the threshold constant should be about 10.5.

This invention may find particular utility in a wideband code division multiple access (WCDMA) system where, during single format transport format detection, it is advantageous for the UE to detect whether the signal was transmitted or not.

The use of this invention improves the Outer Loop Power Control (OLPC), in particular in the case where single transport format detection is used. The function of the OLPC is to maintain the quality of the radio link at a desired level. However, the 3GPP (Third Generation Partnership Project) standard does not require that the quality of the radio link be maintained for the case when the single transport format detection is used. Thus, as other solution that is currently allowed by the 3GPP standard, the UE can disable the OLPC (i.e., freeze the signal to interference ratio (SIR) target) during single transport format detection. However, this currently allowed solution can be shown to result in degraded power control and WCDMA system performance. As such, the use of this invention is particularly attractive for WCDMA single transport format detection.

The foregoing description has provided by way of exemplary and non-limiting examples a full and informative description of the best method and apparatus presently contemplated by the inventors for carrying out the invention. However, various modifications and adaptations may become apparent to those skilled in the relevant arts in view of the foregoing description, when read in conjunction with the accompanying drawings and the appended claims. As but one example, in the foregoing description all of the inequalities can be replaced by ratio inequalities, for example, the inequality (1) becomes $SE_AE_B(L)/SE_AE_B(1) \leq const$; e.g. const=1.125. However, all such and similar modifications of the teachings of this invention will still fall within the scope of this invention.

Further, some of the features of the present invention could be used to advantage without the corresponding use of other features. As such, the foregoing description should be considered as merely illustrative of the principles of the present invention, and not in limitation thereof.

What is claimed is:

1. A method comprising:
   executing in a decoder an iterative turbo decoding process comprising a plurality of decoding rounds on a signal received from a channel;
   at each of the plurality of decoding rounds, determining a soft value that depends in part on a value derived from at least one extrinsic value;
   monitoring, during the plurality of decoding rounds, the value derived from the at least one extrinsic value;
   based on a change in the monitored value, determining whether the signal comprises a valid code word or comprises only noise; and
   based on the determining, outputting from the decoder a decision on whether or not the signal comprises a valid code word.

2. A method as in claim 1, where the decoder comprises one of a LogMap or a MaxLogMap turbo decoder.

3. A method as in claim 1, where
   based on a change in the monitored values comprises determining that the signal is a valid code word when absolute values of the at least one extrinsic value tends to increase, and where
   determining whether the signal comprises a valid code word or comprises only noise further comprises obtaining information that is indicative of the quality of the iterative decoding process to distinguish a valid code word from noise.

4. A method as in claim 1, where said decoder comprises part of a wideband code division multiple access (WCDMA) user equipment.

5. The method of claim 1, wherein the determining is based on a quality of convergence of the iterative decoding process and the quality is based on a change in the monitored values.

6. A method to operate a decoder when receiving a signal through a channel, comprising:
   monitoring, during operation of the decoder on a signal received from a channel, the value of at least one extrinsic value; and
   based on the monitored at least one value, determining whether the signal comprises a valid code word or comprises only noise, where
   the decoder comprises a turbo decoder, and where the turbo decoder comprises a detector that considers at least one inequality where:
   1) $SE_A E_B(L) \leq const1 \times SE_A E_B(1)$;
   2) $SE_A E_B(L) \leq const2 \times S$;
   3) $SE_A(L) \leq const3 \times S$;
   4) $SE_B(L) \leq const3 \times S$;
   5) $E_A(L) \leq const4 \times E_A(1)$;
   6) $E_B(L) \leq const4 \times E_B(1)$;
   7) $E_A E_B(L) \leq const4 \times E_A E_B(1)$;
   8) $E_A(L) \leq const5 \times S$; and
   9) $E_B(L) \leq const5 \times S$;
   where L represents the number of a last turbo decoder round, where $\leq$ represents 'less than or equal to', where X represents times (multiplication), and where const represents a constant value, where if any one of inequalities are found to be true, then it is determined that the received signal does not comprise a valid turbo coded code word, and where
   $SE_A E_B(n)$ denotes a sum of absolute values of soft values after an $n^{th}$ turbo round;
   $E_A E_B(n)$ denotes a sum of absolute values of sums of extrinsic values of A-parities and extrinsic values of B-parities after an $n^{th}$ turbo round;
   $E_A(n)$ denotes a sum of absolute values of extrinsic values of A-parities after the $n^{th}$ turbo round;
   $E_B(n)$ denotes a sum of absolute values of extrinsic values of B-parities after the $n^{th}$ turbo round;
   $SE_A(n)$ denotes a sum of absolute values of sums of systematic samples and extrinsic values of A-parities after the $n^{th}$ turbo round;
   $SE_B(n)$ denotes a sum of absolute values of sums of systematic samples and extrinsic values of B-parities after the $n^{th}$ turbo round; and
   S denotes a sum of absolute values of systematic samples.

7. A method as in claim 6, where a sum of absolute values of systematic samples is at least one of replaced and complemented by a sum of absolute values of parity samples.

8. A method as in claim 6, where const1 equals about 1.125, where const2 equals about 1.5, where const3 equals about 1.25, where const4 equals about 2, and where const5 equals about 0.8.

9. A method as in claim 6, where the threshold constants const1, const2, const3, const4, and const5 are greater when applying an inequality as a quality detector than as a noise/signal detector.

10. A method as in claim 6, where the value of const is a function of a coding rate.

11. A decoder comprising:
    means for executing in a plurality of decoding rounds an iterative turbo decoding process on a signal received from a channel;
    means for determining, at each of the plurality of decoding rounds, a soft value that depends in part on a value derived from at least one extrinsic value;
    means for monitoring, during the plurality of decoding rounds, the value derives from the at least one extrinsic value; and
    means, responsive to a change in the monitored value, for determining whether the signal comprises a valid code word or comprises only noise; and
    means for outputting, from the means for executing and based on the means for determining, a decision on whether or not the signal comprises a valid code word.

12. A decoder as in claim 11, where the decoder comprises one of a LogMap or a MaxLogMap turbo decoder.

13. A decoder as in claim 11, where
    responsive to a change in the monitored values comprises determining that the signal is a valid code word when absolute values of the at least one extrinsic value tends to increase, and where
    said means for determining whether the signal comprises a valid code word or comprises only noise also obtains information that is indicative of the quality of the decoding process to distinguish a valid code word from noise.

14. A decoder as in claim 11, where said decoder comprises part of a wideband code division multiple access (WCDMA) user equipment.

15. The decoder of claim 11, wherein the means for determining is responsive to a change in quality of convergence of the iterative decoding process and the quality is based on a change in the monitored values.

16. A decoder having an input for coupling to a signal received through a channel, comprising:
    means for monitoring, during operation of the decoder on a signal received from the channel, the value of at least one extrinsic value; and
    means, responsive to the monitored at least one value, for determining whether the signal comprises a valid code word or comprises only noise, where the decoder comprises a turbo decoder, and where the turbo decoder comprises a detector that considers at least one inequality where:
1) $SE_A E_B(L) \leq const1 \times SE_A E_B(1)$;
2) $SE_A E_B(L) \leq const2 \times S$;
3) $SE_A(L) \leq const3 \times S$;
4) $SE_B(L) \leq const3 \times S$;
5) $E_A(L) \leq const4 \times E_A(1)$;
6) $E_B(L) \leq const4 \times E_B(1)$;
7) $E_A E_B(L) \leq const4 \times E_A E_B(1)$;
8) $E_A(L) \leq const5 \times S$; and
9) $E_B(L) \leq const5 \times S$;

where L represents the number of a last turbo decoder round, where $\leq$ represents 'less than or equal to', where X represents times (multiplication), and where const represents a constant value, where if any one of inequalities are found to be true, then it is determined that the received signal does not comprise a valid turbo coded code word, and where $SE_A E_B(n)$ denotes a sum of absolute values of soft values after an $n^{th}$ turbo round;

$E_A E_B(n)$ denotes a sum of absolute values of sums of extrinsic values of A-parities and extrinsic values of B-parities after an $n^{th}$ turbo round;

$E_A(n)$ denotes a sum of absolute values of extrinsic values of A-parities after the $n^{th}$ turbo round;

$E_B(n)$ denotes a sum of absolute values of extrinsic values of B-parities after the $n^{th}$ turbo round;

$SE_A(n)$ denotes a sum of absolute values of sums of systematic samples and extrinsic values of A-parities after the $n^{th}$ turbo round;

$SE_B(n)$ denotes a sum of absolute values of sums of systematic samples and extrinsic values of B-parities after the $n^{th}$ turbo round; and S denotes a sum of absolute values of systematic samples.

17. A decoder as in claim 16, where a sum of absolute values of systematic samples is at least one of replaced and complemented by a sum of absolute values of parity samples.

18. A decoder as in claim 16, where const1 equals about 1.125, where const2 equals about 1.5, where const3 equals about 1.25, where const4 equals about 2, and where const5 equals about 0.8.

19. A decoder as in claim 16, where the threshold constants const1, const2, const3, const4, and const5 are greater when applying an inequality as a quality detector than as a noise/signal detector.

20. A decoder as in claim 16, where the value of const is a function of a coding rate.

21. An integrated circuit, comprising:
a turbo decoder having an input for coupling to a signal received through a channel, said turbo decoder configured to iteratively decode the signal in a plurality of decoding rounds by determining at each of the plurality of rounds a soft value that depends in part on a value of at least one extrinsic value; and
a detector coupled to the turbo decoder and configured to monitor, during the plurality of decoding rounds, values of the at least one extrinsic value and configured to determine, based on a change in the monitored values, whether the signal comprises a valid code word or comprises only noise; and
said turbo decoder further configured to output, based on the determination, a decision on whether or not the signal comprises a valid code word.

22. The integrated circuit of claim 21, where the turbo decoder comprises one of a LogMap or a MaxLogMap turbo decoder.

23. The integrated circuit of claim 21, where based on a change in the monitored values comprises determining that the signal comprises a valid code word when absolute values of the at least one extrinsic values tend to increase, and the detector is further configured to obtain information that is indicative of the quality of the decoding process.

24. The integrated circuit of claim 21, where the detector is configured to consider a relationship between at least one pair of absolute values of at least one of extrinsic values and systematic samples.

25. The integrated circuit of claim 21, wherein the detector is configured to determine whether the signal comprises a valid codeword or comprises only noise based on a quality of convergence of the iterative decoding process and the quality is based on a change in the monitored values.

26. A radio frequency receiver, comprising:
a turbo decoder having an input for coupling to a signal received through a channel, said turbo decoder configured to iteratively decode the signal in a plurality of decoding rounds by determining at each of the plurality of rounds a soft value that depends in part on a value of at least one extrinsic value; and
a detector coupled to the turbo decoder and configured to monitor, during the plurality of decoding rounds, values of the at least one extrinsic value and configured to determine, based on a change in the monitored values, whether the signal comprises a valid code word or comprises only noise;
said turbo decoder further configured to output, based on the determination, a decision on whether or not the signal comprises a valid code word.

27. The radio frequency receiver of claim 26, where the turbo decoder comprises one of a LogMap or a MaxLogMap turbo decoder.

28. The radio frequency receiver of claim 26, where based on a change in the monitored values comprises determining that the signal comprises a valid code word when absolute values of the at least one extrinsic value tends to increase, and the detector is further configured to obtain information that is indicative of the quality of the decoding process.

29. The radio frequency receiver of claim 26, where the detector is configured to consider a relationship between at least one pair of absolute values of at least one of extrinsic values and systematic samples.

30. The radio frequency receiver of claim 26, comprising a part of a cellular telephone.

31. The radio frequency receiver of claim 26, wherein the detector is configured to determine whether the signal comprises a valid codeword or comprises only noise based on a quality of convergence of the iterative decoding process and the quality is based on a change in the monitored values.

32. A decoder comprising:
an input for coupling to a signal received through a channel;
decoding circuitry configured to iteratively decode the input signal in a plurality of decoding rounds by determining, in each of the decoding rounds, a soft value that depends in part on a value of at least one extrinsic value;
a detector coupled to the decoding circuitry and configured to monitor, during the decoding rounds, values of the at least one extrinsic value and configured to determine, based on a change in the monitored values, whether the signal comprises a valid code word or comprises only noise;

wherein the decoding circuitry and the detector are configured to output, based on the determination, a decision on whether or not the signal comprises a valid code word.

33. The decoder as in claim 32, operable as a LogMap or a MaxLogMap turbo decoder.

34. The decoder of claim 32, wherein the detector is configured to determine whether the signal comprises a valid codeword or comprises only noise based on a quality of convergence of the iterative decoding process and the quality is based on a change in the monitored values.

* * * * *

UNITED STATES PATENT AND TRADEMARK OFFICE
CERTIFICATE OF CORRECTION

PATENT NO. : 7,272,771 B2 Page 1 of 1
APPLICATION NO. : 10/696926
DATED : September 18, 2007
INVENTOR(S) : Nieminen It is certified that error appears in the above-identified patent and that said Letters Patent is hereby corrected as shown below:

IN THE CLAIMS:

In Claim 11: Column 12, line 33, delete "derives" and replace with --derived--

Signed and Sealed this

Eighteenth Day of December, 2007

JON W. DUDAS
*Director of the United States Patent and Trademark Office*